(12) United States Patent
Jeong et al.

(10) Patent No.: US 8,998,446 B2
(45) Date of Patent: Apr. 7, 2015

(54) OPTICAL FILM AND ORGANIC LIGHT EMITTING DISPLAY APPARATUS COMPRISING THE SAME

(75) Inventors: Chul-Woo Jeong, Yongin (KR); Soon-Ryong Park, Yongin (KR); Hee-Seong Jeong, Yongin (KR); Woo-Suk Jung, Yongin (KR); Tae-Kyu Kim, Yongin (KR); Il-Ryong Cho, Yongin (KR); Duk-Jin Lee, Yongin (KR); Sung-Soo Koh, Yongin (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 766 days.

(21) Appl. No.: 12/976,716

(22) Filed: Dec. 22, 2010

(65) Prior Publication Data
US 2011/0157887 A1 Jun. 30, 2011

(30) Foreign Application Priority Data
Dec. 24, 2009 (KR) .................. 10-2009-0131202

(51) Int. Cl.
F21V 1/00 (2006.01)
F21V 11/00 (2006.01)
G02B 5/20 (2006.01)
G02B 5/22 (2006.01)

(52) U.S. Cl.
CPC ............... *G02B 5/201* (2013.01); *G02B 5/223* (2013.01)

(58) Field of Classification Search
USPC ......... 362/235, 800, 236, 237, 555, 600–630, 362/97.1–97.4, 311.02; 359/614
See application file for complete search history.

(56) References Cited

U.S. PATENT DOCUMENTS

| 6,384,970 | B1 | 5/2002 | Abe et al. |
| 7,184,210 | B2* | 2/2007 | Thomas et al. ............... 359/443 |
| 7,502,169 | B2* | 3/2009 | Wood ............................ 359/619 |
| 2005/0140879 | A1 | 6/2005 | Nam |
| 2007/0261951 | A1 | 11/2007 | Ye et al. |
| 2008/0037124 | A1 | 2/2008 | Ohmi et al. |
| 2009/0122226 | A1 | 5/2009 | Hwang et al. |
| 2010/0157590 | A1* | 6/2010 | Munro et al. ................. 362/235 |

(Continued)

FOREIGN PATENT DOCUMENTS

| JP | 2000-147668 A | 5/2000 |
| JP | 2004-127662 A | 4/2004 |
| JP | 2006-184298 A | 7/2006 |

(Continued)

OTHER PUBLICATIONS

Korean Office Action dated Jul. 29, 2011 for Korean Patent Application No. KR-2009-0131202 which corresponds to captioned U.S. Appl. No. 12/976,716.

*Primary Examiner* — Anh Mai
*Assistant Examiner* — Jessica M Apenteng
(74) *Attorney, Agent, or Firm* — Knobbe, Martens, Olson & Bear, LLP

(57) ABSTRACT

An optical film and an organic light emitting display apparatus including the optical film are disclosed. In one embodiment, the optical film is formed on a substrate of the organic light emitting display, and the substrate is configured to transmit light, emitted from an organic light emission unit of the display, toward the optical film. Further, the optical film is configured to absorb ambient light via a first portion, and the optical film is further configured to at least partially transmit light emitted from the organic light emission unit to the environment via a second portion.

16 Claims, 5 Drawing Sheets

(56) References Cited

U.S. PATENT DOCUMENTS

2010/0195323 A1* 8/2010 Schaefer et al. ............. 362/235
2011/0116262 A1* 5/2011 Marson ........................ 362/235

FOREIGN PATENT DOCUMENTS

| | | |
|---|---|---|
| JP | 2007-232640 A | 9/2007 |
| JP | 2008-203812 A | 9/2008 |
| JP | 2009-230045 A | 10/2009 |
| KR | 10-2005-0068194 A | 7/2005 |
| KR | 10-2006-0108307 A | 10/2006 |
| KR | 10-2008-0086756 A | 9/2008 |
| KR | 10-2009-0026067 A | 3/2009 |
| KR | 10-2009-0026125 A | 3/2009 |
| WO | WO 2005/096037 A1 | 10/2005 |

* cited by examiner

OPTICAL FILM AND ORGANIC LIGHT EMITTING DISPLAY APPARATUS COMPRISING THE SAME

CROSS-REFERENCE TO RELATED PATENT APPLICATION

This application claims the benefit of Korean Patent Application No. 10-2009-0131202, filed on Dec. 24, 2009, in the Korean Intellectual Property Office, the disclosure of which is incorporated herein in its entirety by reference.

BACKGROUND

1. Field

The disclosed technology generally relates to an optical film, which reduces the reflection of external light on a display, and an organic light emitting display apparatus including the optical film.

2. Description of the Related Technology

In general, flat panel displays may be classified into an emissive type and a non-emissive type. The emissive type display may include, for example, flat cathode ray tubes, plasma display panels (PDPs), and electroluminescent devices. The non-emissive type display may include liquid crystal displays (LCDs). Here, the organic electroluminescent device is self-emissive and electrically excites fluorescent organic compounds to emit light. Further, electroluminescent devices have a wide viewing angle, excellent contrast, rapid response speed and low power consumption, and thus they have recently been considered as a next generation display. Such electroluminescent devices may be categorized into either inorganic or organic devices according to the materials used to form the emission layer.

SUMMARY OF CERTAIN INVENTIVE ASPECTS

One inventive aspect is an optical film, which may prevent the reflection of external light, and an organic light emitting display apparatus including the optical film.

Another aspect is an optical film in an organic light emitting display apparatus, wherein the apparatus includes a first substrate, an organic light emission unit disposed on the first substrate and including a plurality of organic light emitting devices, and a second substrate, the optical film being disposed on the second substrate to collect light emitted from the organic light emission unit, emit the collected light, absorb external light, and prevent the reflection of the external light.

The optical film may include a plurality of fine structures; and a light absorbing member that is interposed between the plurality of fine structures and absorbs external light, wherein the plurality of fine structures collect light emitted from the organic light emitting display apparatus and emit light to the outside and the light absorbing member absorbs incident light from the outside and prevents the reflection of the incident light.

The fine structures may each include: a first penetration unit disposed on a first surface of the optical film, which faces the outside; a second penetration unit disposed on a second surface facing the first surface; a boundary unit which connects the first penetration unit and the second penetration unit and forms the side of the fine structures; and a reflection unit disposed on the boundary unit, wherein an area of the first penetration unit is smaller than an area of the second penetration unit.

The first penetration unit and the second penetration unit may allow light to penetrate through the first penetration unit and the second penetration unit. The first surface and the second surface may be smooth surfaces. The reflection unit may be formed of a metal thin film which reflects light incident on the reflection unit. The boundary unit may curve in toward the first surface.

The light absorbing member may be interposed between the fine structures and a portion of the light absorbing member may be exposed at the first surface. A center unit of each of the fine structures may include a transparent resin material.

A refractive index of the transparent resin material may vary in a direction from the first surface to the second surface.

The refractive index of the transparent resin material may increase in a direction from the first surface to the second surface. The refractive index of the transparent resin material may be greater than that of the light absorbing member.

One organic light emitting device may correspond to the plurality of fine structures. Intervals of the fine structures may be smaller than those of the organic light emitting devices. The intervals of the fine structures each may be about 200 nm to about 250 nm.

Another aspect is an organic light emitting display apparatus including: a first substrate; an organic light emission unit disposed on the first substrate and including a plurality of organic light emitting devices; a second substrate covering the first substrate; and an optical film disposed on the second substrate, wherein the optical film collects light emitted from the organic light emission unit, emits the collected light, absorbs external light, and prevents the reflection of the external light.

The optical film may include: a plurality of fine structures; and a light absorbing member that is interposed between the plurality of fine structures and absorbs external light, the plurality of fine structures collecting light emitted from the organic light emitting display apparatus and emitting light to the outside and the light absorbing member absorbing incident light from the outside and preventing the reflection of the incident light.

The fine structures each may include: a first penetration unit disposed on a first surface of the optical film, which faces the outside; a second penetration unit disposed on a second surface facing the first surface; a boundary unit which connects the first penetration unit and the second penetration unit and forms the side of the fine structures; and a reflection unit disposed on the boundary unit, wherein an area of the first penetration unit is smaller than an area of the second penetration unit.

The first penetration unit and the second penetration unit may allow light to penetrate through the first penetration unit and the second penetration unit. The first surface and the second surface may be smooth surfaces. The reflection unit may be formed of a metal thin film which reflects light incident on the reflection unit.

The boundary unit may curve in toward the first surface. A center unit of each of the fine structures may include a transparent resin material. A refractive index of the transparent resin material may vary in a direction from the first surface to the second surface.

The refractive index of the transparent resin material may increase in a direction from the first surface to the second surface. The refractive index of the transparent resin material may be greater than that of the light absorbing member.

One organic light emitting device may correspond to the plurality of fine structures. Intervals of the fine structures may be smaller than those of the organic light emitting devices. The intervals of the fine structures each may be about 200 nm to about 250 nm.

Another aspect is an optical film in an organic light emitting display, wherein the optical film is formed on a substrate of the organic light emitting display, wherein the substrate is configured to transmit light, emitted from an organic light emission unit of the display, toward the optical film, wherein the optical film is configured to absorb ambient light via a first portion, and wherein the optical film is further configured to at least partially transmit light emitted from the organic light emission unit to the environment via a second portion.

The above optical film further comprises: a light absorbing member formed in the first portion and configured to absorb ambient light so that reflection of the absorbed light is prevented; and a plurality of fine structures formed in the second portion and configured to at least partially transmit light emitted from the organic light emission unit to the environment, wherein the light absorbing member is interposed between the fine structures.

In the above optical film, each of the fine structures comprises: a first penetration unit formed on a first surface of the optical film, which faces the environment; a second penetration unit formed on a second surface facing the substrate; a boundary unit which connects the first penetration unit and the second penetration unit and forms the side of the fine structure; and a reflection unit formed on the boundary unit, wherein the area of the first penetration unit is smaller than the area of the second penetration unit.

In the above optical film, the first penetration unit and the second penetration unit are configured to penetrate light therethrough. In the above optical film, each of the first and second surfaces is substantially even. In the above optical film, the reflection unit is formed of a metal thin film which reflects light incident on the reflection unit.

In the above optical film, each of the fine structures further comprises a center unit formed between the first and second penetration units and surrounded by the reflection unit, and wherein the center unit is formed of a transparent resin material. In the above optical film, a refractive index of the transparent resin material varies in a direction from the first surface to the second surface. In the above optical film, the refractive index of the transparent resin material increases in a direction from the first surface to the second surface.

In the above optical film, the refractive index of the transparent resin material is greater than that of the light absorbing member. In the above optical film, the reflection unit further comprises a resin thin film coated on the metal thin film. In the above optical film, each of the fine structures further comprises a center unit formed between the first and second penetration units and surrounded by the reflection unit, and wherein the center unit is empty.

In the above optical film, the boundary unit curves in toward the first surface. In the above optical film, the light absorbing member is interposed between the fine structures and wherein a portion of the light absorbing member is exposed to the environment. In the above optical film, the organic light emission unit comprises a plurality of organic light emitting devices, and wherein one organic light emitting device corresponds to a plurality of fine structures.

In the above optical film, the organic light emission unit comprises a plurality of organic light emitting devices, and wherein the fine structures are more closely spaced part than those of the organic light emitting devices. In the above optical film, the fine structures are spaced apart from about 200 nm to about 250 nm.

Another aspect is an organic light emitting display comprising: a first substrate; an organic light emission unit formed over the first substrate and comprising a plurality of organic light emitting devices; a second substrate covering the first substrate; and an optical film formed on the second substrate, wherein the second substrate is configured to transmit light, emitted from the organic light emission unit, toward the optical film, wherein the optical film is configured to absorb ambient light via a first portion, and wherein the optical film is further configured to at least partially transmit light emitted from the organic light emission unit to the environment via a second portion.

In the above apparatus, the optical film comprises: a light absorbing member formed in the first portion and configured to absorb ambient light so that reflection of the absorbed light is prevented; and a plurality of fine structures formed in the second portion and configured to at least partially transmit light emitted from the organic light emission unit to the environment, wherein the light absorbing member is interposed between the fine structures.

In the above apparatus, each of the fine structures comprise: a first penetration unit formed on a first surface of the optical film, which faces the environment; a second penetration unit formed on a second surface facing the second substrate; a boundary unit which connects the first penetration unit and the second penetration unit and forms the side of the fine structure; a reflection unit disposed on the boundary unit; and a center unit formed between the first and second penetration units and surrounded by the reflection unit, wherein the area of the first penetration unit is smaller than the area of the second penetration unit.

Another aspect is an organic light emitting display comprising: a substrate; a first electrode; a second electrode; an organic light emission layer interposed between the first and second electrodes and configured to emit light via the substrate, wherein the first electrode is closer to the substrate than the second electrode; and an optical film formed on the substrate, wherein the optical film has first and second surfaces opposing each other, wherein the first surface is exposed to the environment, and wherein the second surface contacts the substrate, wherein a light absorbing region and a plurality of light transmitting regions are defined in the optical film, wherein the light transmitting regions are substantially evenly spaced apart in the optical film, wherein the light absorbing region is formed between the light transmitting regions, wherein the light transmitting regions are configured to i) at least partially transmit light emitted from the organic light emission layer to the environment and ii) receive ambient light and transmit at least part of the received light, which is reflected from the first electrode, to the environment, and wherein the light absorbing region is configured to absorb ambient light so that reflection of the absorbed light is prevented.

DETAILED DESCRIPTION OF CERTAIN INVENTIVE EMBODIMENTS

An organic electroluminescent device includes an emission layer that is formed of an organic material and interposed between an anode and a cathode. As an anode voltage and a cathode voltage are respectively applied to the anode and the cathode, holes injected from the anode move to the emission layer through a hole transport layer and electrons move from the cathode to the emission layer through an electron transport layer so that the holes and the electrons recombine in the emission layer to form excitons.

The exciton in an excited state transitions to a ground state so that fluorescent molecules of the emission layer radiate, thereby forming an image. A full-color type organic electroluminescent device includes pixels that emit red R, green G, and blue B colors to realize full color. In such an organic electroluminescent device, a pixel defining layer is formed on both ends of the anode. An opening of a predetermined size and location is formed in the pixel defining layer. Then, the emission layer and the cathode are sequentially formed on the anode exposed to the environment through the opening.

Hereinafter, one or more embodiments will be described more fully with reference to the accompanying drawings.

Figure 1:
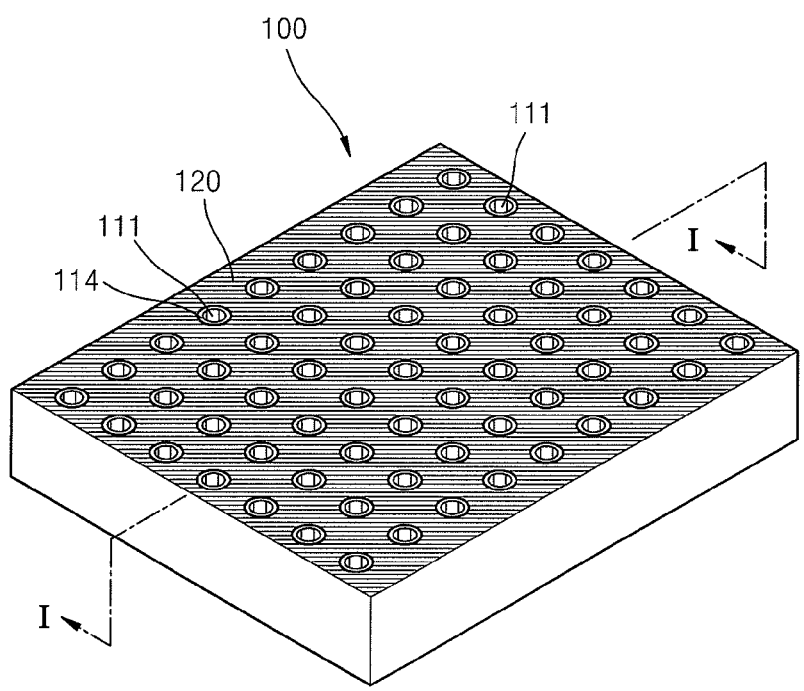
FIG. 1 is a perspective view of an optical film according to an embodiment.
Figure 2:
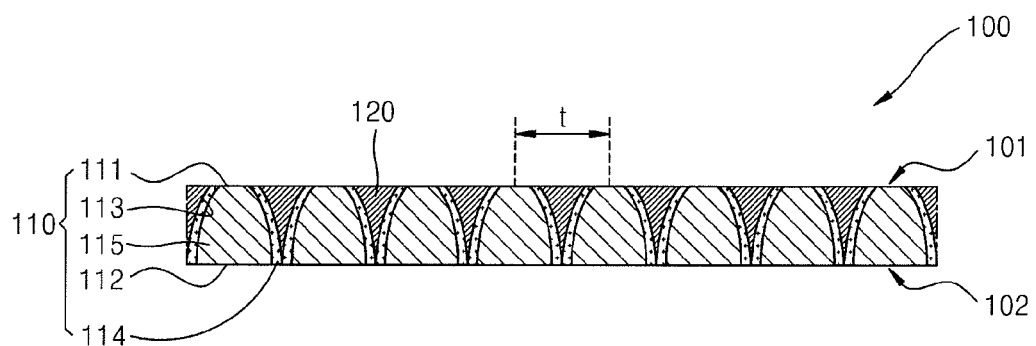
FIG. 2 is a cross-sectional view of the optical film of FIG. 1 taken along the line of FIG. 1.
Figure 3:
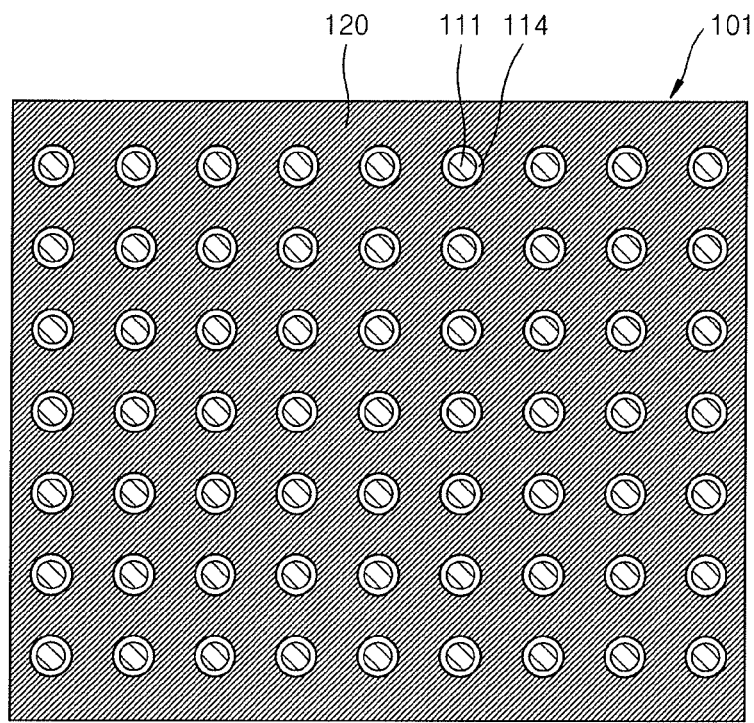
FIG. 3 is a plan view of the optical film of FIG. 1.

FIG. 1 is a perspective view of an optical film 100, according to an embodiment, FIG. 2 is a cross-sectional view of the optical film 100 taken along the line I-I of FIG. 1, and FIG. 3 is a plan view of the optical film 100. Reference numerals 100A and 100B refer to first and second portions, respectively.

Figure 6:
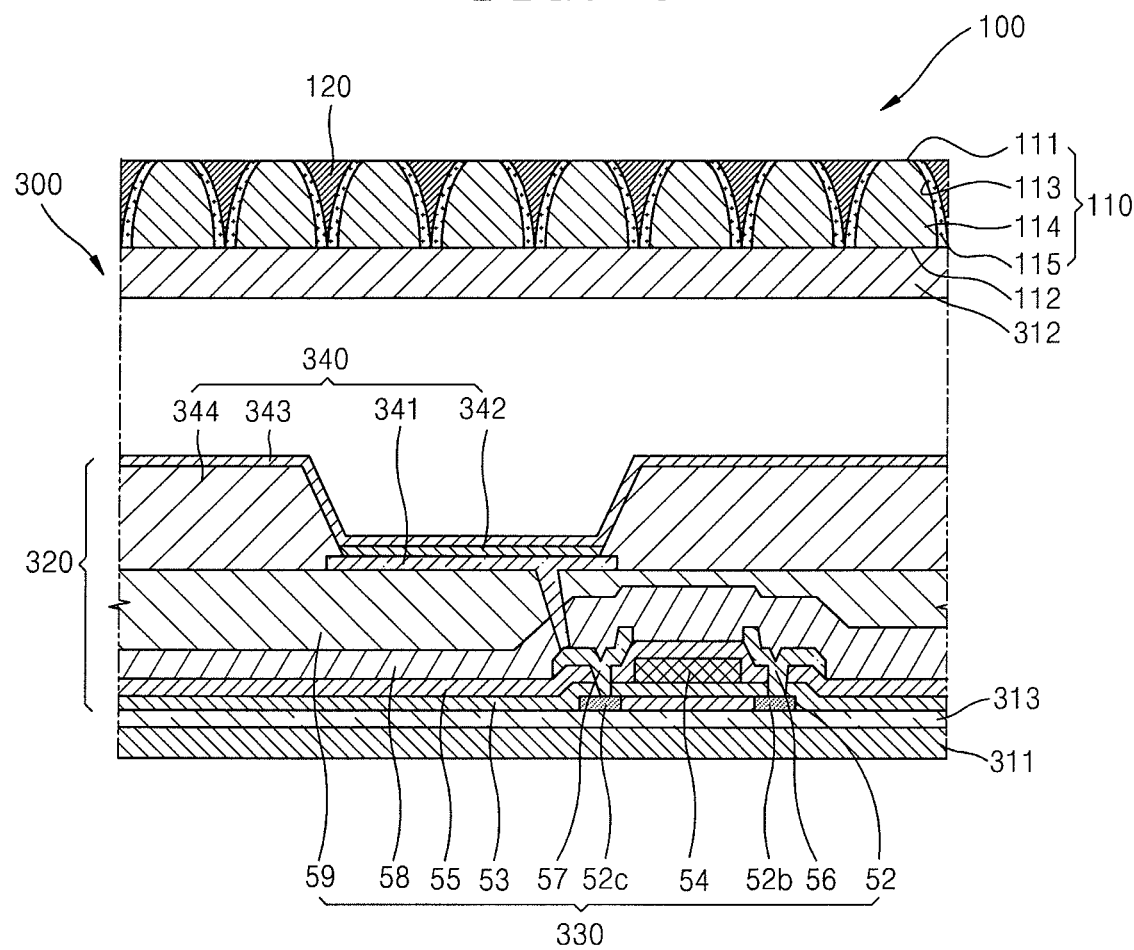
FIG. 6 is a cross-sectional view of an organic light emitting display apparatus including the optical film of FIG. 1, according to an embodiment.

The optical film 100, which is disposed on one surface of an organic light emitting display apparatus 300 of FIG. 6, collects light emitted from the organic light emitting display apparatus 300 and emits the collected light to the outside. Also, the optical film 100 absorbs light incident from the outside toward the organic light emitting display apparatus 300 and prevents the reflection of light from the outside. In this regard, the optical film 100 may include a fine structure 110 (see FIG. 2) and a light absorbing member 120. The fine structure 110 collects light emitted from the organic light emitting display apparatus 300 and emits the collected light to some space that is external to the device (namely, a viewing environment). The light absorbing member 120 absorbs light incident from the outside and prevents the reflection of light.

Referring to FIGS. 1 through 3, the fine structure 110 may include a first penetration unit 111, a second penetration unit 112, a boundary unit 113, a center unit 115, and a reflection unit 114.

The first penetration unit 111 and the second penetration unit 112 are disposed to face each other on the optical film 100. More specifically, the first penetration unit 111 is disposed on a first surface 101 of the optical film 100, which faces the outside. The second penetration unit 112 is disposed on a second surface 102 facing the first surface 101. The second surface 102 faces the first surface 101 and the organic light emitting display apparatus 300. Here, the first surface 101 and the second surface 102 may be smooth surfaces (or substantially even), respectively.

Light penetrates through the first penetration unit 111 and the second penetration unit 112. More specifically, the first penetration unit 111 is disposed on the first surface 101 and the second penetration unit 112 is disposed on the second surface 102 so that light emitted from the organic light emitting display apparatus 300 penetrates the second penetration unit 112 and the first penetration unit 111 and is emitted to the outside. Also, external light may be incident on the organic light emitting display apparatus 300 through the first penetration unit 111 and the second penetration unit 112.

In one embodiment, the area of the first penetration unit 111 is smaller than that of the second penetration unit 112. In one embodiment, as shown in FIG. 3, on the first surface 101 of the light absorbing member 120, the light absorbing member 120 exists between the first penetration units 111. For example, the light absorbing member 120 is disposed throughout the first surface 101 and the first penetration units 111 are arranged on the light absorbing member 120. Light may be emitted through the first penetration unit 111 and may be incident on the organic light emitting display apparatus 300 of FIG. 6. Here, a portion of external light may be absorbed by the light absorbing member 120. In one embodiment, the second penetration unit 112 is disposed only on the second surface 102. In one embodiment, the light absorbing member 120 is not disposed on the second surface 102. In another embodiment, the light absorbing member 120 may be disposed on the second surface 102 so that an area of the second penetration unit 112 is larger than that of the first penetration unit 111.

The boundary unit 113 denotes a boundary surface between the fine structure 110 and the light absorbing member 120. The boundary unit 113 may be formed to curve in toward the first surface 101. The boundary unit 113 may have a curved surface from the second penetration unit 112 to the first penetration unit 111. Accordingly, a cross-section surface of the fine structure 110 may be substantially gradually smaller from the second penetration unit 112 to the first penetration unit 111. As the boundary unit 113 is formed to curve in toward the first surface 101, as stated above, light may be collected, as will be described later.

The reflection unit 114 is disposed on the boundary unit 113. That is, the reflection unit 114 is disposed on the boundary unit 113 toward the inside of the fine structure 110. The reflection unit 114 reflects light that is incident on the first penetration unit 111 or the second penetration unit 112 and faces the reflection unit 114. As the reflection unit 114 is formed on the boundary unit 113 that is formed to curve in toward the first surface 101, the reflection unit 114 is formed to concave toward the second surface 102 and thus light repeatedly reflected by the reflection unit 114 may be collected. The reflection unit 114 may be formed of a metal thin film which may reflect light incident toward the reflection unit 114, for example, aluminum (Al), gold (Au), silver (Ag), or platinum (Pt).

The center unit 115 denotes the inside of the fine structure 110 and is surrounded by the first penetration unit 111, the second penetration unit 112, and the reflection unit 114. The center unit 115 may be formed of a transparent resin. In one embodiment, a refractive index of a transparent resin material of the center unit 115 varies. For example, the refractive index of the transparent resin material of the center unit 115 varies in a transverse direction of the fine structure 110, that is, a direction toward the second surface 102 from the first surface 101. For example, the refractive index of a transparent resin material of the center unit 115 may increase in a direction toward the second surface 102 from the first surface 101. Also, the lowest refractive index in a portion of the transparent resin material of the center unit 115 may be greater than the refractive index of the light absorbing member 120.

Intervals of a plurality of fine structures 110 may be smaller than intervals of organic light emitting devices (for example, sub-pixels). Accordingly, the plurality of fine structures 110 are arranged to correspond to one organic light emitting device. As the intervals of the fine structures 110 are smaller than the intervals of the organic light emitting devices, it is not required to align the fine structures 110 to correspond to the organic light emitting device. The interval t of the fine structures 110 may be about 200 nm to about 250 nm. When the fine structures 110 are arranged with the intervals therebetween, an image realized in the organic light emitting display apparatus 300 of FIG. 6 may be prevented from being distorted.

The light absorbing member 120 is disposed between the fine structures 110. That is, the first penetration units 111 are disposed above the fine structures 110, the second penetration units 112 are disposed below the fine structures 110, and the boundary units 113 are disposed at the side of the fine structures 110. The light absorbing member 120 contacts the side of the fine structures 110, thereby forming the boundary units 113. As illustrated in FIGS. 1 through 3, a part of the light absorbing member 120 may be exposed at the first surface 101. However, the light absorbing member 120 may not be exposed at the second surface 102. Although not illustrated in FIGS. 1 through 3, an area of the light absorbing member 120 exposed at the first surface 101 may be smaller than an area of the light absorbing member 120 exposed at the second surface 102. Accordingly, the area of the second penetration unit 112 may be greater than the area of the first penetration unit 111. The light absorbing member 120 may absorb light incident on the light absorbing member 120. That is, the light absorbing member 120 exposed at the first surface 101 absorbs light incident on the organic light emitting display apparatus 300 of FIG. 6 from outside the device and thus prevents the light being reflected back outside. Accordingly, the contrast of the organic light emitting display apparatus 300 is generally improved.

The light absorbing member 120 may be formed of a material that may absorb light. For example, the light absorbing member 120 may be formed of a carbon material indicating black. However, the light absorbing member 120 may be formed of a material having various colors that may absorb light.

Figure 4:
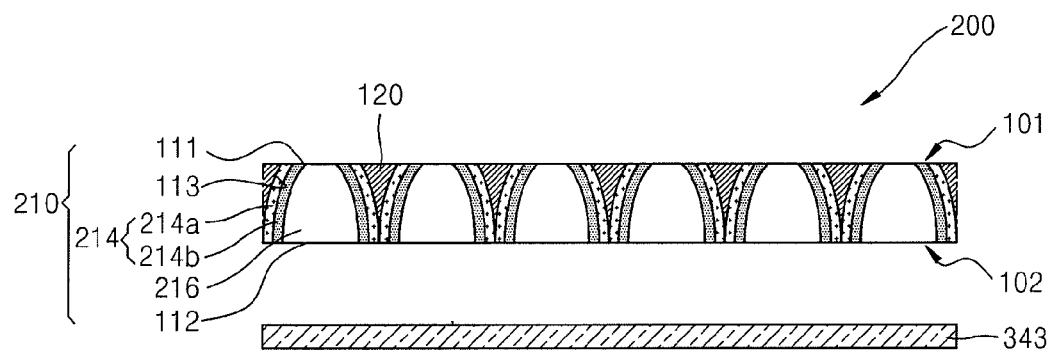
FIG. 4 is a cross-sectional view of an optical film according to another embodiment.

FIG. 4 is a cross-sectional view of an optical film 200 according to another embodiment. The optical film 200 according to the current embodiment further includes a reflection unit 214 and a center unit 216, compared with the optical film 100 illustrated in FIGS. 1 through 3. Other elements included in the optical film 200 are similar with or same as those of the optical film 100 and thus detailed descriptions thereof will not be repeated.

Referring to FIG. 4, the reflection unit 214 may include a metal thin film 214a and a resin thin film 214b. The metal thin film 214a is disposed on the boundary unit 113. The resin thin film 214b is disposed on the metal thin film 214a. Also, a center unit 215 of a fine structure 210 may be empty. That is, the metal thin film 214a and the resin thin film 214b are sequentially formed on the boundary unit 113 toward the center unit 216 of fine structure 210 in the order stated and one surface of the resin thin film 214b contacts the empty center unit 216. Accordingly, light incident on the reflection unit 214 through the first penetration unit 111 or the second penetration unit 112 is reflected by the metal thin film 214a. Here, the resin thin film 214b may increase reflection efficiency. The resin thin film 214b may be formed of a transparent resin material having a high refractive index.

Figure 5:
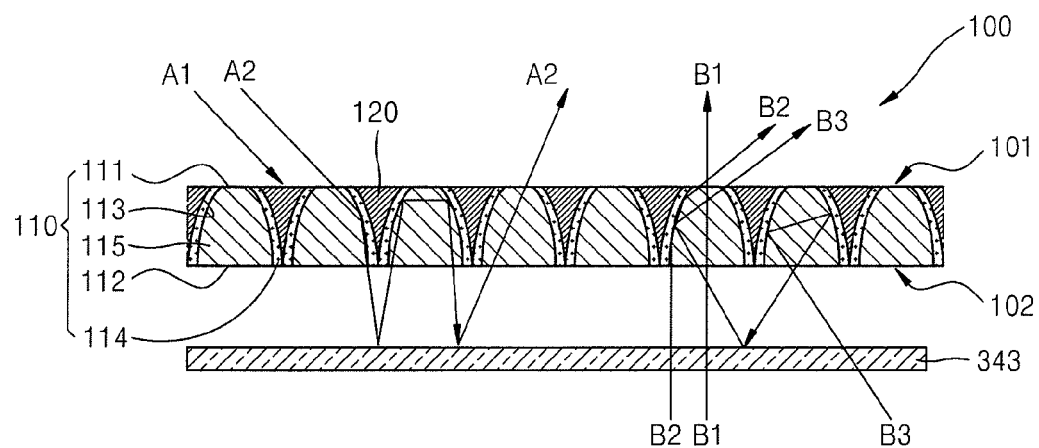
FIG. 5 is a cross-sectional view showing the operation of the optical film of FIG. 1.

FIG. 5 is a cross-sectional view showing the operation of the optical film 100 illustrated in FIG. 1.

Referring to FIG. 5, light Al that is incident on the light absorbing member 120 from light incident on the optical film 100 from the outside is absorbed by the light absorbing member 120 and is not reflected to the outside. Accordingly, the reflection of external light is reduced and thus the contrast of the organic light emitting display apparatus 300 may be improved.

Light A2 incident through the first penetration unit 111 from light facing the optical film 100 from the outside penetrates the first penetration unit 111 and is incident on the center unit 115 of the fine structure 110. The light A2 incident on the center unit 115 may reach the reflection unit 114 of the fine structure 110 and may be reflected by the reflection unit 114. Such reflected light is reflected again by an opposite electrode 343 of the organic light emitting display apparatus 300 of FIG. 6 and may be directed to the optical film 100. Light reflected by the opposite electrode 343 passes through the second penetration unit 112, is directed to the center unit 115, and may be reflected again by the reflection unit 114. Accordingly, light incident on the organic light emitting display apparatus 300 of FIG. 6 from the outside is repeatedly reflected by the reflection unit 114 and the opposite electrode 343 and is further collected. Then, the collected light may be emitted again to the outside through the first penetration unit 111.

A portion of light B1 emitted from the organic light emitting display apparatus 300 may exit through the second penetration unit 112, the center unit 115, and the first penetration unit 111 without reflection. Another light B2 emitted from the organic light emitting display apparatus 300 passes the second penetration unit 112, is reflected by the reflection unit 114, and may be emitted to the outside through the first penetration unit 111. Another light B3 emitted from the organic light emitting display apparatus 300 is repeatedly reflected by the reflection unit 114 and the opposite electrode 343 and is collected. Then, the collected light may exit through the first penetration unit 111.

Accordingly, the optical film 100 according to the current embodiment absorbs external light and prevents the reflection of the external light. Also, the organic light emitting display apparatus 300 collects and emits light, thereby improving light extraction efficiency.

Figure 7:
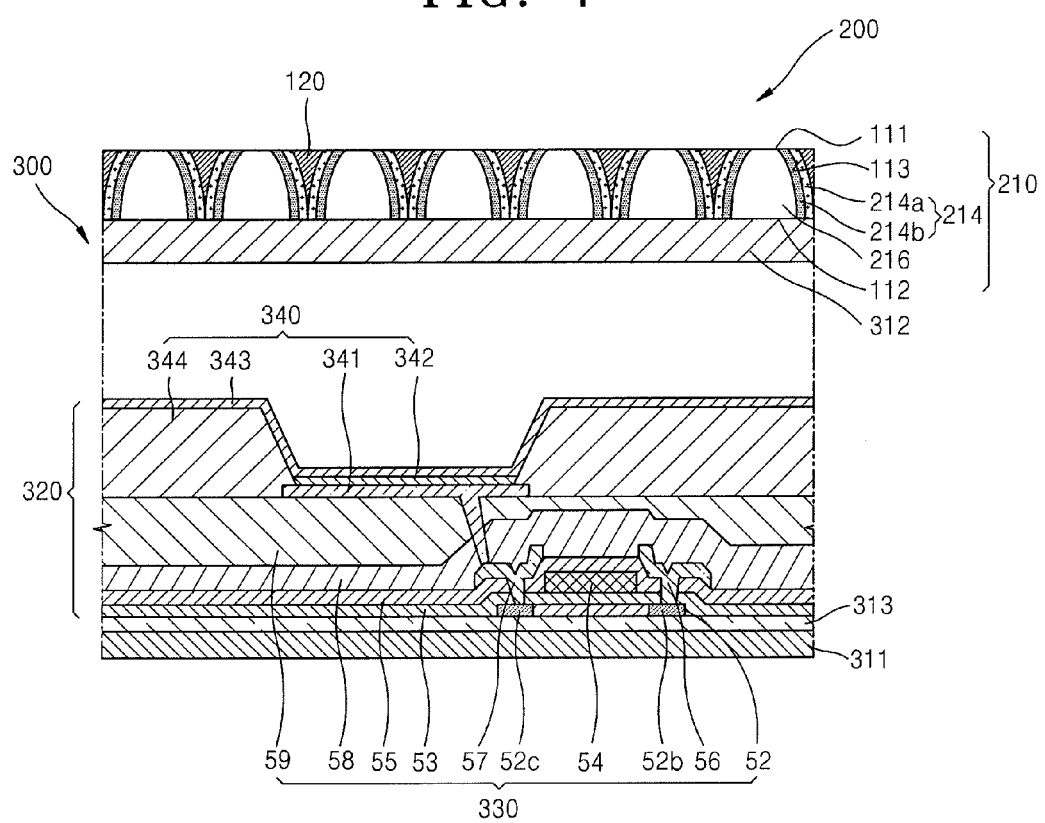
FIG. 7 is a cross-sectional view of an organic light emitting display apparatus including the optical film of FIG. 4, according to another embodiment.

FIG. 6 is a cross-sectional view of the organic light emitting display apparatus 300 including the optical film 100 illustrated in FIG. 1, and FIG. 7 is a cross-sectional view of the organic light emitting display apparatus 300 including the optical film 200 illustrated in FIG. 4, according to embodiments. In FIGS. 6 and 7, the organic light emitting display apparatus 300 is an active matrix (AM) type. In FIGS. 6 and 7, sub-pixels include at least one thin film transistor (TFT) and organic light emitting device, which is a self-luminous device. However, the TFT is not limited to the structure of FIGS. 6 and 7 and the number of TFTs and the structure of the TFT may vary. Such an AM type organic light emitting display apparatus may be described more fully as follows.

Referring to FIG. 6, a buffer layer 313 may be formed on a first substrate 311. An organic light emission unit 320 and a second substrate 312 are sequentially formed on the buffer layer 313 in the order stated. The optical film 100 may be disposed on the second substrate 312. Referring to FIG. 7, the optical film 200 may be disposed on the second substrate 312.

The organic light emission unit 320 may include a pixel circuit unit 330 and an organic light emitting device 340. The organic light emission unit 320 is formed by sequentially forming the pixel circuit unit 330 and the organic light emitting device 340 on the buffer layer 313 in the order stated. The pixel circuit unit 330 may be the TFT.

An active layer 52 having a predetermined pattern is partially formed on the buffer layer 313. A gate insulation film 53 is formed on the active layer 52 and the buffer layer 313, and a gate electrode 54 is formed on a predetermined area of the gate insulation film 53. The gate electrode 54 is connected to a gate line (not illustrated) via which a TFT on/off signal is applied. An interlayer insulation film 55 is formed on the gate electrode 54 and the gate insulation film 53 and source/drain electrodes 56 and 57 are formed to contact source/drain regions 52b and 52c, respectively, through contact holes. An insulation film 58 is formed on the source/drain electrodes 56 and 57. The insulation film 58 may be a passivation film formed of, for example, $SiO_2$ or SiNx. A planarization film 59 formed of an organic material such as acryl, polyimide, or benzocyclobutene (BCB) may be formed on the insulation film 58.

In one embodiment, a pixel electrode 341, which is an anode of an organic light emitting device, is formed on the planarization film 59 and a pixel defining layer 344 formed of an organic material is formed to cover the pixel electrode 341. After a predetermined opening is formed in the pixel defining layer 344, an intermediate layer 342 is formed on the pixel defining layer 344 and a portion of the pixel electrode 341 exposed through the opening. Here, the intermediate layer 342 includes an emission layer. The present invention is not limited to the above structure and structures of various organic light emitting display apparatuses may be used.

The organic light emitting device 340 displays predetermined image information by emitting red, green, and blue light according to a flow of current. The organic light emitting device 340 includes the pixel electrode 341, the opposite electrode 343, and the intermediate layer 342, wherein the pixel electrode 341 is connected to the drain electrode 57 and receives a positive power voltage from the drain electrode 57, the opposite electrode 343 is disposed to cover the entire pixel and receives a negative voltage power, and the intermediate layer 342 is interposed between the pixel electrode 341 and the opposite electrode 343 and emits light. The pixel electrode 341 and the opposite electrode 343 are insulated from each other by the intermediate layer 342 and apply voltages having different polarities, thereby emitting light in the intermediate layer 342.

The intermediate layer 342 may include low-molecular weight organic layers or polymer organic layers. If the intermediate layer 342 includes the low-molecular weight organic layers, the intermediate layer 342 may have a single or multi-layered structure including at least one selected from the group consisting of a hole injection layer (HIL), a hole transport layer (HTL), an emission layer (EML), an electron transport layer (ETL), and an electron injection layer (EIL). Examples of available organic materials may include copper phthalocyanine (CuPc), N'-Di(naphthalene-1-yl)-N,N'-diphenyl-benzidine (NPB), or tris-8-hydroxyquinoline aluminum (Alq3). These low-molecular weight organic layers may be formed by using vacuum deposition.

If the intermediate layer 342 includes the polymer organic layers, the intermediate layer 342 may mostly have a structure including a HTL and an EML. In this case, the HTL may be formed of, for example, poly(ethylenedioxythiophene) (PEDOT), and the EML may be formed of, for example, polyphenylenevinylenes (PPVs) or polyfluorenes. The HTL and the EML may be formed by screen printing, inkjet printing, or the like. The intermediate layer 342 is not limited thereto and may vary in structure.

The intermediate layer 342 may be formed by using spin coating. More specifically, an organic material is coated to cover the pixel electrode 341 and the pixel defining layer 344. Then, the first substrate 311 is rotated. The organic material coated on the pixel defining layer 344 is removed according to the rotation of the first substrate 311 and the organic material coated on the pixel electrode 341 remains. Then, the organic material coated on the pixel electrode 341 is plasticized so as to form the intermediate layer 342.

The pixel electrode 341 may function as an anode and the opposite electrode 343 functions as a cathode; however the present invention is not limited thereto, and the pixel electrode 341 may function as a cathode and the opposite electrode 343 functions as an anode.

The pixel electrode 341 may be a transparent or reflective electrode. If the pixel electrode 341 is a transparent electrode, the pixel electrode 341 may be formed of, for example, indium tin oxide (ITO), indium zinc oxide (IZO), zinc oxide (ZnO), or indium oxide ($In_2O_3$). If the pixel electrode 341 is a reflective electrode, the pixel electrode 341 may be formed by forming a reflective unit using, for example, silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer using, for example, ITO, IZO, ZnO, or $In_2O_3$ on the reflective unit.

In addition, the opposite electrode 343 may be a transparent or reflective electrode. If the opposite electrode 343 is a transparent electrode, the opposite electrode 343 functions as a cathode and thus is formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on surface of the organic layer 62 and forming an auxiliary electrode layer or a bus electrode line on the deposited metal by using a material for forming a transparent electrode such as ITO, IZO, ZnO, or $In_2O_3$, or the like. If the opposite electrode 343 is a reflective electrode, the opposite electrode 343 is formed by depositing, for example, Li, Ca, LiF/Ca, LiF/Al, Al, Ag, Mg, or a compound thereof on the entire surface of the pixel electrode 341.

After the organic light emission unit 320 is formed, the organic light emission unit 320 is sealed using a sealing member (not shown). The sealing member may be formed by alternately stacking organic thin film layers and inorganic thin film layers or may be formed of a metal layer.

The second substrate 312 may be formed of a material having high transmissivity so that light generated from the organic light emission unit 320 may penetrate the second substrate 312. As described above, the optical film 100 or 200 is formed on the second substrate 312.

As illustrated in FIGS. 6 and 7, the fine structures 110 and 210 of the optical films 100 and 200 are smaller than the pixel of the organic light emitting device 340. In one embodiment, the fine structures 110 and 210 do not correspond to the pixels in a one to one correspondence and a plurality of fine structures 110 and 210 may correspond to one pixel. Accordingly, the optical film 100 or the optical film 200 may be disposed on the second substrate 312 without an additional aligning process between the organic light emitting device 340 and the fine structures 110 and 210.

At least one embodiment prevents the reflection of external light. Also, light emitted from an organic light emitting display apparatus is collected and emitted so that light extraction efficiency may be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An optical film in an organic light emitting display, wherein the optical film is formed on a substrate of the organic light emitting display, wherein the substrate is configured to transmit light, emitted from an organic light emission unit of the display, toward the optical film, wherein the optical film is configured to absorb ambient light via a first portion, and wherein the optical film is further configured to transmit light emitted from the organic light emission unit to the environment via a second portion, and wherein the optical film further comprises:
a light absorbing member formed in the first portion and configured to absorb ambient light; and
a plurality of fine structures formed in the second portion and configured to transmit light emitted from the organic light emission unit to the environment, wherein the light absorbing member is interposed between and contacts the fine structures,
wherein each of the fine structures comprises:
a first penetration surface formed on a first surface of the optical film, which faces the environment;
a second penetration surface formed on a second surface facing the substrate;
a boundary unit which connects the first penetration surface and the second penetration surface and forms the side of the fine structure; and
a reflection unit formed on the boundary unit,
wherein the area of the first penetration surface is smaller than the area of the second penetration surface, and
wherein the first and second penetration surfaces are substantial parallel to each other.

2. The optical film of claim 1, wherein the first penetration surface and the second penetration surface are configured to penetrate light therethrough.

3. The optical film of claim 1, wherein each of the first and second surfaces is substantially even.

4. The optical film of claim 1, wherein the reflection unit is formed of a metal thin film which reflects light incident on the reflection unit.

5. The optical film of claim 4, wherein the reflection unit further comprises a resin thin film coated on the metal thin film.

6. The optical film of claim 5, wherein each of the fine structures further comprises a center unit formed between the first and second penetration surfaces and surrounded by the reflection unit, and wherein the center unit is empty.

7. The optical film of claim 1, wherein each of the fine structures further comprises a center unit formed between the first and second penetration surfaces and surrounded by the reflection unit, and wherein the center unit is formed of a transparent resin material.

8. The optical film of claim 7, wherein a refractive index of the transparent resin material varies in a direction from the first surface to the second surface.

9. The optical film of claim 8, wherein the refractive index of the transparent resin material increases in a direction from the first surface to the second surface.

10. The optical film of claim 7, wherein the refractive index of the transparent resin material is greater than that of the light absorbing member.

11. The optical film of claim 1, wherein the boundary unit curves in toward the first surface.

12. The optical film of claim 1, wherein a portion of the light absorbing member is exposed to the environment.

13. An optical film in an organic light emitting display, wherein the optical film is formed on a substrate of the organic light emitting display, wherein the substrate is configured to transmit light, emitted from an organic light emission unit of the display, toward the optical film, wherein the optical film is configured to absorb ambient light via a first portion, and wherein the optical film is further configured to transmit light emitted from the organic light emission unit to the environment via a second portion, and wherein the optical film further comprises:
a light absorbing member formed in the first portion and configured to absorb ambient light; and
a plurality of fine structures formed in the second portion and configured to transmit light emitted from the organic light emission unit to the environment, wherein the light absorbing member is interposed between and contacts the fine structures,
wherein each of the fine structures comprises:
a first penetration surface formed on a first surface of the optical film, which faces the environment; and
a second penetration surface formed on a second surface facing the substrate;
wherein the area of the first penetration surface is smaller than the area of the second penetration surface,
wherein the first and second penetration surfaces are substantially parallel to each other, and
wherein the organic light emission unit comprises a plurality of organic light emitting devices, and wherein one organic light emitting device corresponds to a plurality of fine structures.

14. An optical film in an organic light emitting display, wherein the optical film is formed on a substrate of the organic light emitting display, wherein the substrate is configured to transmit light, emitted from an organic light emission unit of the display, toward the optical film, wherein the optical film is configured to absorb ambient light via a first portion, and wherein the optical film is further configured to transmit light emitted from the organic light emission unit to the environment via a second portion, and wherein the optical film further comprises:
a light absorbing member formed in the first portion and configured to absorb ambient light; and
a plurality of fine structures formed in the second portion and configured to transmit light emitted from the organic light emission unit to the environment, wherein the light absorbing member is interposed between and contacts the fine structures,
wherein each of the fine structures comprises:
a first penetration surface formed on a first surface of the optical film, which faces the environment; and
a second penetration surface formed on a second surface facing the substrate;
wherein the area of the first penetration surface is smaller than the area of the second penetration surface,
wherein the first and second penetration surfaces are substantially parallel to each other, and
wherein the organic light emission unit comprises a plurality of organic light emitting devices, wherein one organic light emitting device corresponds to a plurality of fine structures, and wherein the fine structures are more closely spaced than the organic light emitting devices.

15. The optical film of claim 14, wherein the fine structures are spaced apart from about 200 nm to about 250 nm.

16. An organic light emitting display comprising:
a first substrate;
an organic light emission unit formed over the first substrate and comprising a plurality of organic light emitting devices;
a second substrate covering the first substrate; and
an optical film formed on the second substrate, wherein the second substrate is configured to transmit light, emitted from the organic light emission unit, toward the optical film,
wherein the optical film is configured to absorb ambient light via a first portion, and wherein the optical film is further configured to transmit light emitted from the organic light emission unit to the environment via a second portion,
and wherein the optical film comprises:
a light absorbing member formed in the first portion and configured to absorb ambient light; and
a plurality of fine structures formed in the second portion and configured to transmit light emitted from the organic light emission unit to the environment, wherein the light absorbing member is interposed between and contacts the fine structures,
wherein each of the fine structures comprises:
a first penetration surface formed on a first surface of the optical film, which faces the environment;
a second penetration surface formed on a second surface facing the second substrate;
a boundary unit which connects the first penetration surface and the second penetration surface and forms the side of the fine structure;
a reflection unit disposed on the boundary unit; and
a center unit formed between the first and second penetration surfaces and surrounded by the reflection unit,
wherein the area of the first penetration surface is smaller than the area of the second penetration surface, and
wherein the first and second penetration surfaces are substantially parallel to each other.

* * * * *